United States Patent
Narukawa

(10) Patent No.: US 6,933,609 B2
(45) Date of Patent: Aug. 23, 2005

(54) INTERCONNECTION STRUCTURE AND INTERCONNECTION STRUCTURE FORMATION METHOD

(75) Inventor: Kuniyuki Narukawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 81 days.

(21) Appl. No.: 10/342,227

(22) Filed: Jan. 15, 2003

(65) Prior Publication Data

US 2003/0157750 A1 Aug. 21, 2003

(30) Foreign Application Priority Data

Feb. 14, 2002 (JP) .................................. 2002-037393

(51) Int. Cl.$^7$ .............................................. H01L 23/48
(52) U.S. Cl. ...................... 257/758; 257/762; 257/763
(58) Field of Search ...................... 257/758, 761–765; 438/622, 629, 637, 648, 675, 680, 687

(56) References Cited

U.S. PATENT DOCUMENTS

| | | | | |
|---|---|---|---|---|
| 5,407,698 A | * | 4/1995 | Emesh ......................... | 427/99 |
| 5,817,572 A | * | 10/1998 | Chiang et al. ............... | 438/624 |
| 5,933,758 A | * | 8/1999 | Jain ............................ | 438/687 |
| 6,136,682 A | * | 10/2000 | Hegde et al. ................ | 438/622 |
| 6,150,272 A | * | 11/2000 | Liu et al. ..................... | 438/692 |
| 6,410,418 B1 | * | 6/2002 | Yang ........................... | 438/626 |
| 6,440,844 B1 | * | 8/2002 | Takagi et al. ................ | 438/637 |

FOREIGN PATENT DOCUMENTS

| | | | | |
|---|---|---|---|---|
| JP | 11-87353 | * | 3/1999 | ....... H01L/21/3205 |
| WO | WO 02/41379 A1 | * | 5/2002 | ......... H01L/21/285 |

OTHER PUBLICATIONS

Wolf, S., Silicon Processing For the VLSI Era, vol. 2, Lattice Press, pp. 190–191.*

* cited by examiner

Primary Examiner—T. N. Quach
(74) Attorney, Agent, or Firm—Westerman, Hattori, Daniels & Adrian, LLP

(57) ABSTRACT

An insulating film covering a Cu interconnection is formed. A contact hole which partially exposes the surface of the Cu interconnection is formed in the insulating film. A series of steps (steps (a) to (d)) including (a) a step of continuously supplying $WF_6$ gas for a predetermined time, (b) a step of continuously exhausting the $WF_6$ gas atmosphere for a predetermined time, (c) a step of continuously supplying $SiH_4$ gas for a predetermined time, and (d) a step of continuously exhausting the $SiH_4$ gas atmosphere for a predetermined time, is repeatedly executed to form W nuclei in the contact hole. Then, a W film is buried into the contact hole. This interconnection structure formation method can reliably bury the W film into the contact hole while preventing Cu elution from the Cu interconnection to the W plug.

4 Claims, 6 Drawing Sheets

INTERCONNECTION STRUCTURE AND INTERCONNECTION STRUCTURE FORMATION METHOD

CROSS-REFERENCE TO RELATED APPLICATIONS

This application is based upon and claims priority of Japanese Patent Application No. 2002-037393, filed on Feb. 14, 2002, the contents being incorporated herein by reference.

BACKGROUND OF THE INVENTION

1. Field of the Invention

The present invention relates to an interconnection structure suitably applicable to a semiconductor device and a method of forming the same.

2. Description of the Related Art

As a conventional interconnection formation technique for semiconductor integrated circuits, a technique of forming a metal film represented by an aluminum (Al) film or an Al alloy film by sputtering is generally extensively used.

However, to meet the recent demands for further downsized and integrated semiconductor devices, micropatterned interconnections and multilayer interconnections are acceleratedly advanced. In a logic device having this multilayer interconnection, a wiring delay is becoming a dominant cause of a device signal delay. A signal delay of a device is proportional to the product of a wiring resistance and a wiring capacitance. Accordingly, to improve the wiring delay, it is important to reduce the wiring resistance and the wiring capacitance. To this end, it is presently necessary to select suitable interconnection materials and contact hole burying materials and develop a technique which forms interconnections by using the selected materials without causing any inconveniences in fabrication.

SUMMARY OF THE INVENTION

The present invention has been made to solve the above problem, and has as its object to provide an interconnection structure capable of preventing a wiring delay and obtaining a micropatterned, multilayer interconnection, and an interconnection structure formation method which realizes a highly reliable interconnection structure by solving various problems unique to the materials of the interconnection structure, e.g., elution of one material to the other.

The present inventor made extensive studies, and has reached the following various aspects of the present invention.

An interconnection structure of the present invention comprises a lower interconnection made of a material containing at least copper, an insulating film formed on the lower interconnection and having a hole which opens into the lower interconnection, and a refractory metal film so formed as to fill at least the hole and to be electrically connected to the lower interconnection.

In the present invention, a formation method which implements the above interconnection structure comprises, when filling the hole with the refractory metal material by depositing the refractory metal material, a first step of continuously supplying a compound gas containing a refractory metal to said semiconductor substrate for a certain predetermined time into a chamber in which a semiconductor substrate is placed, and a second step of stopping the supply of the compound gas, and continuously exhausting the chamber for a certain predetermined time. The formation method further comprises a third step of continuously supplying a second reducing gas into the chamber for a certain predetermined time, and a fourth step of stopping the supply of the second reducing gas, and continuously exhausting the chamber for a certain predetermined time. In the formation method, a series of processes including the first to fourth steps is executed once or a plurality of number of times to deposit the refractory metal material so as to have a desired film thickness.

It should be noted that W is most preferable as the refractory metal material. Not only W but also Ta, TaN, TiN, WN, Mo and the like, however, belong to the refractory metal material.

DETAILED DESCRIPTION OF THE PREFERRED EMBODIMENTS

Main Constitution of Present Invention

First, the main constitution of the present invention will be explained below along with its operating principle.

A representative example of a suitable metal material having low wiring resistance is copper (Cu). In the present invention, a Cu interconnection is used, and a refractory metal is used as a metal material for a contact of this Cu interconnection. The advantages of the use of a refractory metal as a burying material are that the interconnection reliability improves and the heat resistance does not easily fluctuate. A representative example of the refractory metal is tungsten (W).

Figure 1:
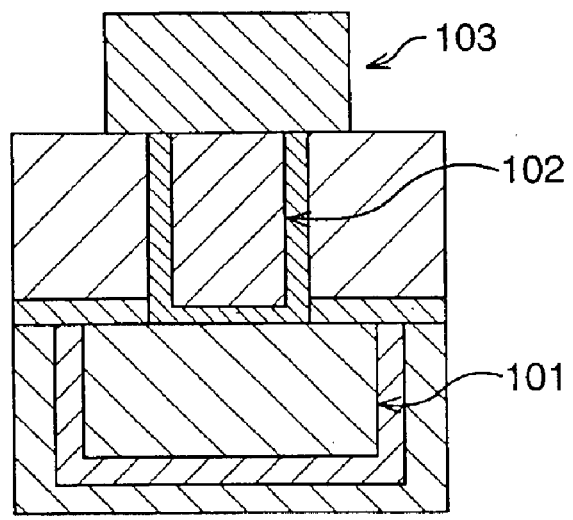
FIG. 1 is a schematic sectional view showing an interconnection structure according to an embodiment of the present invention.

When an interconnection structure using a Cu interconnection as the uppermost layer is formed, the moisture resistance may lower in a fuse formation process. Therefore, the present inventor studied how to improve the moisture resistance of the uppermost layer, and has found that an interconnection structure using a Cu interconnection as a lower layer, an Al interconnection as an upper layer, and a W plug to connect the two layers is advantageous. On the basis of this consideration, the present invention proposes, as shown in FIG. 1, an interconnection structure including Cu interconnection 101—W plug 102—Al interconnection 103.

The following method is possible as a practical method of implementing the above interconnection structure.

First, Si is adsorbed to the surface of a semiconductor substrate (wafer) by using an $SiH_4$-based gas. After that, $SiH_4$-based gas and $WF_6$ gas are used to form a W-nucleus film having high resistance but superior in adhesion properties. $WF_6$ gas and $H_2$ gas are then used to form a blanket W film having low resistance and high coverage.

Figure 2:
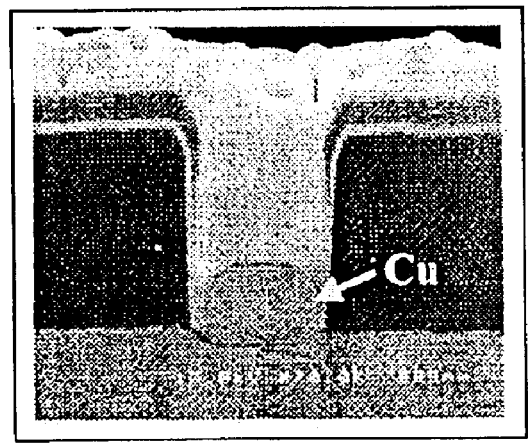
FIG. 2 is a view corresponding to a photomicrograph showing an interconnection structure formed by a way in which a Cu interconnection and a W plug are formed without using an interconnection structure formation method of the present invention.

If a W film is formed by the above formation method, however, as shown in FIG. 2, Cu is eluted from the lower Cu interconnection into a contact hole. This results in high contact resistance and low interconnection reliability, and consequently lowers the yield. This Cu elution largely depends upon the W film formation sequence: Cu is eluted into the contact hole by the reaction between Cu and $SiH_4$ gas when the $SiH_4$ gas is supplied in the initial stages in film formation.

The present invention has as its principal object to prevent this Cu elution, and forms a blanket W film as follows in order to realize the above interconnection structure.

This W film formation method can be roughly divided into three stages (steps 1 to 3).

Step 1:

In a series of initial reaction stages, a wafer is heat-treated (annealed) while $H_2$ gas is supplied to the wafer surface. By this step, the wafer surface can be cleaned without using any halogen-based plasma treatment, and the film formation temperature and the cleaning temperature can be the same. Also, the film formation sequence can be simplified.

Step 2:

Subsequently, W nuclei are formed by alternately supplying $SiH_4$ gas and $WF_6$ gas. By alternately supplying these reaction gases, selectivity to a foundation layer (an adhesive film) can be suppressed. This can suppress invasion to interconnect.

$SiH_4$ gas and $WF_6$ gas are highly reactive to each other. Therefore, if these gases are simply alternately supplied, the flow rate ratio $WF_6$:$SiH_4$ may become larger than 1 under the influence of the residual gas atmosphere. If this flow rate ratio exceeds 1, so-called gas phase particles may be generated. In the present invention, to prevent the generation of these particles, a gas exhaust step of removing the gas atmosphere is preferably introduced after the supply of either $WF_6$ gas or $SiH_4$ gas, so that the flow rate ratio $WF_6$:$SiH_4$ does not exceed 1. The sequence includes (i) a step of continuously supplying $WF_6$ gas for a certain time, (ii) a step of continuously exhausting the $WF_6$ gas atmosphere for a certain time, (iii) a step of continuously supplying $SiH_4$ gas for a certain time, and (iv) a step of continuously exhausting the $SiH_4$ gas atmosphere for a certain time. A series of these steps (steps (i) to (iv)) are repeatedly executed to form W nuclei.

Step 3:

In the final step, a low-resistance and high-coverage W film is formed. $WF_6$/$H_2$ gas, for example, is used as a film formation gas.

Practical Embodiment

On the basis of the main constitution described above, a practical embodiment of the present invention will be described in detail below with reference to the accompanying drawings. In this embodiment, a general MOS transistor is taken as an example of a semiconductor device, and the present invention is applied to its interconnection structure. For the sake of convenience, this interconnection structure will be explained along with its formation method.

FIGS. 3A to 3K are schematic sectional views showing the interconnection structure formation method according to the embodiment of the present invention in order of steps.

Prior to the formation of an interconnection structure, a MOS transistor having a gate electrode and source/drains is formed on a silicon wafer. The present invention is applied to an interconnection structure electrically connected to, e.g., the source/drains of this MOS transistor.

Figure 3A:
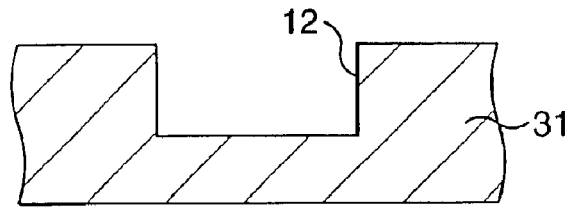
FIGS. 3A to 3K are schematic sectional views showing an interconnection structure formation method according to an embodiment of the present invention in order of steps.

First, as shown in FIG. 3A, a silicon oxide film 31 is deposited by a CVD method so as to cover the MOS transistor on the semiconductor substrate (neither is shown). After that, a Cu interconnection is formed by a so-called damascene process.

More specifically, the silicon oxide film 31 is coated with a photoresist film (not shown), and this photoresist film is processed into the shape of an interconnection by photolithography. This photoresist film is used as a mask to dry-etch the silicon oxide film 31, thereby forming an interconnection groove 12 having the shape of the photoresist in the silicon oxide film 31.

Figure 3B:
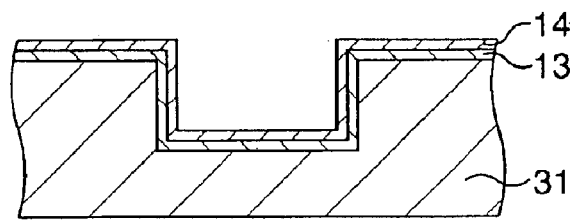

Subsequently, as shown in FIG. 3B, a TaN barrier metal film 13 about 25 nm thick and a Cu film 14 about 200 nm thick as a seed metal film are continuously deposited in a vacuum by a clustered sputtering apparatus, so as to cover the inner wall surfaces of the interconnection groove 12. Note that the RF processing and the formation of the barrier metal film 13 and the Cu film 14 are desirably continuously performed in a vacuum.

Figure 3C:
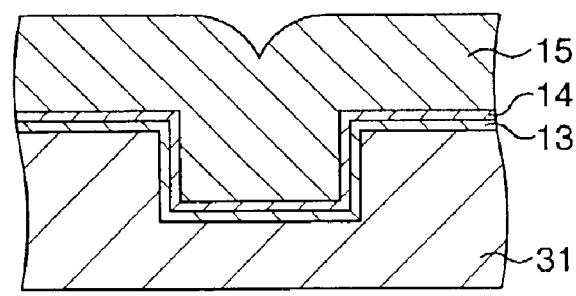

As shown in FIG. 3C, with using the Cu film 14 as an electrode, a Cu film 15 is formed by plating so as to have a film thickness, about 1 $\mu$m in this embodiment, with which the interconnection groove 12 is filled.

Figure 3D:
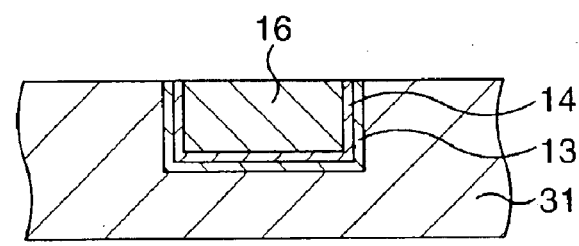

As shown in FIG. 3D, to isolate the Cu film 15 by the damascene process, the Cu film 15 (and 14) and the barrier metal film 13 are polished by a CMP (Chemical Mechanical Polishing) method so as to remain only in the interconnection groove 12, thereby forming a Cu interconnection 16.

Subsequently, a tungsten (W) plug to be electrically connected to the Cu interconnection 16 is formed.

Figure 3E:
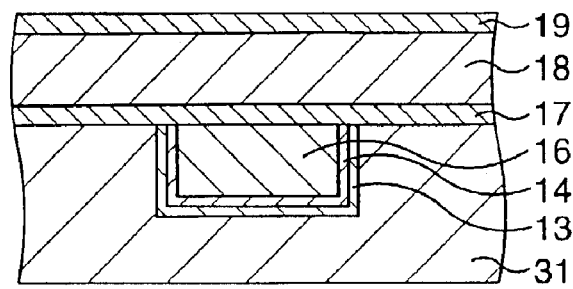

More specifically, as shown in FIG. 3E, a silicon nitride film 17 about 70 nm thick serving as a diffusion barrier (a passivation film) on the surface of the Cu interconnection 16 is deposited. On this silicon nitride film 17, an interlayer insulating film 18 about 700 nm thick made of, e.g., USG is formed.

Figure 3F:
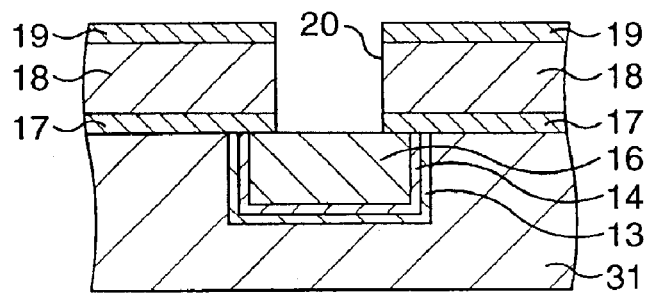

As shown in FIG. 3F, the interlayer insulating film 18 and the silicon nitride film 17 are processed by photolithography and subsequent dry etching, thereby patterning a contact hole 20 which partially exposes the surface of the Cu interconnection 16.

Figure 3G:
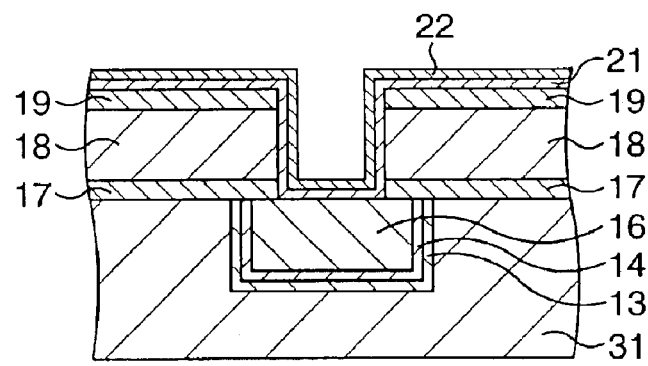

As shown in FIG. 3G, a tantalum nitride (TaN) film 21 about 50 nm thick and a titanium nitride (TiN) film 22 about 50 nm thick are formed in this order on the interlayer insulating film 18, so as to cover the inner wall surface of the contact hole 20. The foundation layer having the stacked structure of the TaN film 21 and the TiN film 22 improves the adhesion between the Cu interconnection 16 and a W plug (to be described later). Note that the foundation layer may also be a single-layered film of either a TaN film or TiN film.

Figure 3H:
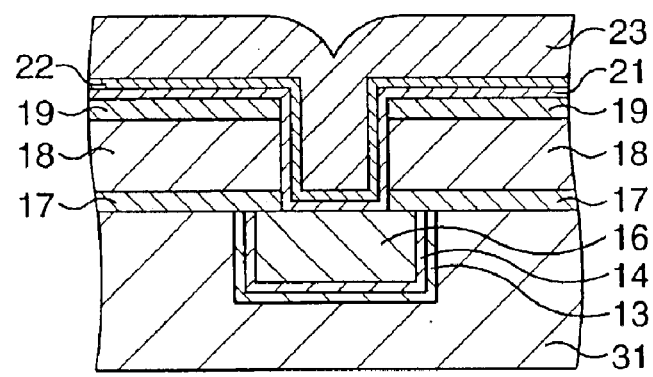

Subsequently, as shown in FIG. 3H, a tungsten (W) film 23 is deposited on the foundation layer by steps 1 to 3 described above, so as to fill the contact hole 20.

Figure 4:
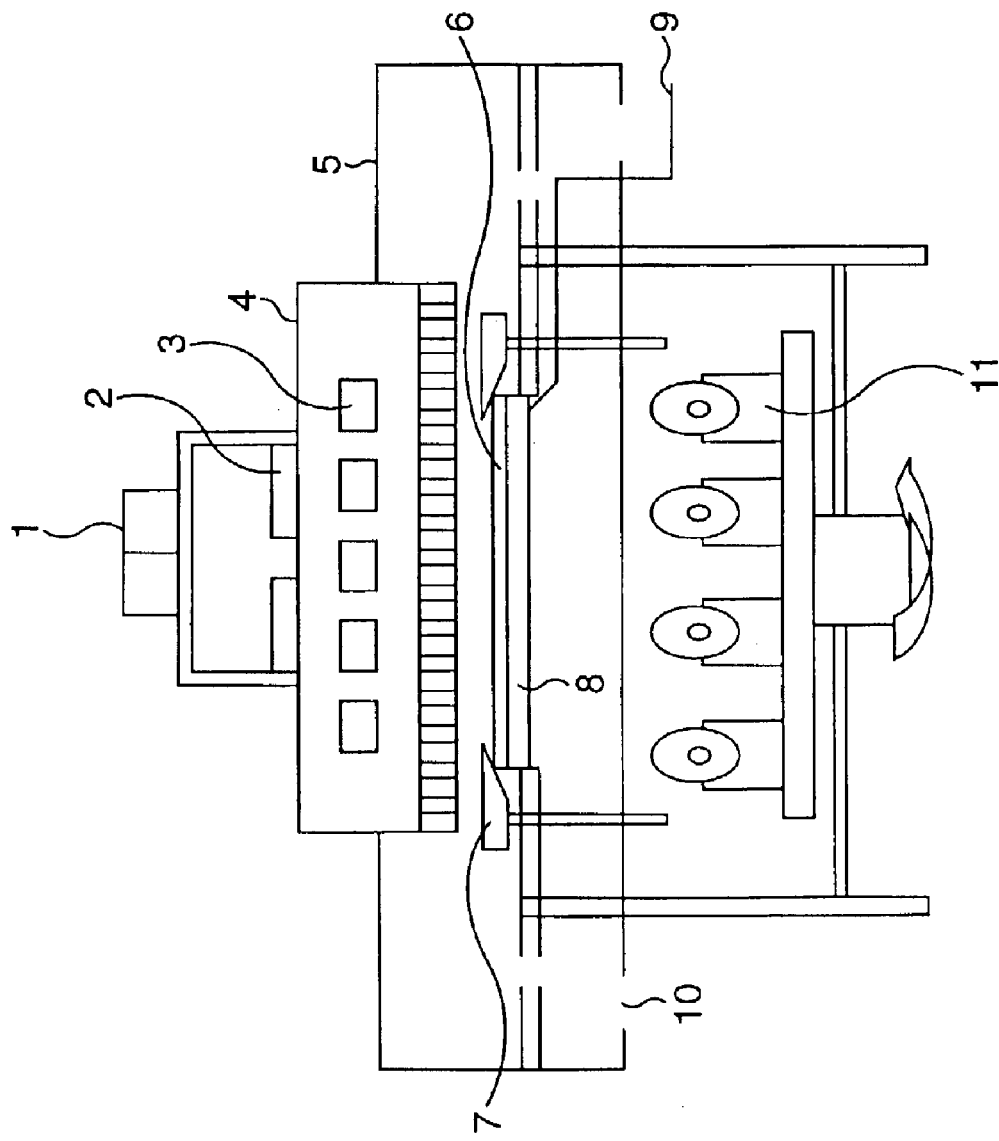
FIG. 4 is a schematic view showing an outline of the arrangement of a CVD apparatus used in the embodiment.

In this deposition, a CVD apparatus as shown in FIG. 4 may be used, for example. This CVD apparatus is provided with a reaction chamber 5, a wafer holder 8 installed in the reaction chamber 5 and capable of holding one or more wafers 6, a heating lamp 11 having a function of heating the wafer 6 and including a rotating mechanism for improving the temperature distribution on the surface of the wafer 6, a mechanism (not shown) for supplying a compound gas and a reducing gas into the reaction chamber 5 and mixing the two gases, and a mechanism (not shown) for exhausting the supplied reaction gases.

In this CVD apparatus, the wafer 6 is loaded into the reaction chamber 5 via a vacuum load-lock chamber (not shown) and placed on the wafer holder 8, and the wafer edge is fixed by a clamp ring 7. In this state, the atmosphere in the reaction chamber 5 is exhausted through an exhaust port 10 to set a vacuum state, and reaction gases (in the present embodiment, a compound gas and reducing gas) are supplied from a gas supply port 1. The reaction gases are supplied into the reaction chamber 5 via a mixing plate 2 and a diffusing plate 3 of a shower head 4. The wafer 6 is heated to a certain predetermined temperature by the heating lamp 11, and the temperature is monitored with a temperature measurement thermocouple 9. The reaction gases supplied into the reaction chamber 5 react with each other on the surface of the wafer 6 to evenly form a film on the entire surface of this wafer 6.

In step 1, the wafer is annealed using $H_2$ gas. Examples of the annealing conditions are as follows.

[$H_2$ annealing conditions]

| | |
|---|---|
| $H_2$ gas flow rate | 1,800 sccm |
| Pressure in chamber | $2.7 \times 10^3$ Pa (20 Torr) |
| Wafer heating temperature | 250° C. to 500° C., 350° C. in this embodiment |

The wafer surface can be evenly annealed by the above annealing process.

In step 2, W nuclei are formed using $WF_6$ gas and $SiH_4$ gas. The film thickness is about 5 to 10 nm. Examples of the W nucleus formation conditions are as follows.

[$WF_6$ gas supply conditions]

| | |
|---|---|
| $WF_6$/Ar/$N_2$ flow rates | 30/2,000/900 sccm |
| Film formation temperature | 250° C. to 500° C., 350° C. in this embodiment |
| Pressure in chamber | $1.0 \times 10^3$ Pa (7.5 Torr) |
| Film formation time | less than 60 sec, 10 sec in this embodiment |

[$WF_6$ gas atmosphere exhaust conditions]

| | |
|---|---|
| Ar/$N_2$ flow rates | 2,000/900 sccm |
| Film formation temperature | 250° C. to 500° C., 350° C. in this embodiment |
| Pressure in chamber | $1.0 \times 10^3$ Pa (7.5 Torr) |
| Film formation time | less than 60 sec, 5 sec in this embodiment |

[$SiH_4$ gas supply conditions]

| | |
|---|---|
| $SiH_4$/Ar/$N_2$ flow rates | 18/2,000/900 sccm |
| Film formation temperature | 250° C. to 500° C., 350° C. in this embodiment |
| Pressure in chamber | $1.0 \times 10^3$ Pa (7.5 Torr) |
| Film formation time | less than 60 sec, 10 sec in this embodiment |

[$SiH_4$ gas atmosphere exhaust conditions]

| | |
|---|---|
| Ar/$N_2$ flow rates | 2,000/900 sccm |
| Film formation temperature | 250° C. to 500° C., 350° C. in this embodiment |
| Pressure in chamber | $1.0 \times 10^3$ Pa (7.5 Torr) |
| Film formation time | less than 60 sec, 5 sec in this embodiment |

Figure 5:
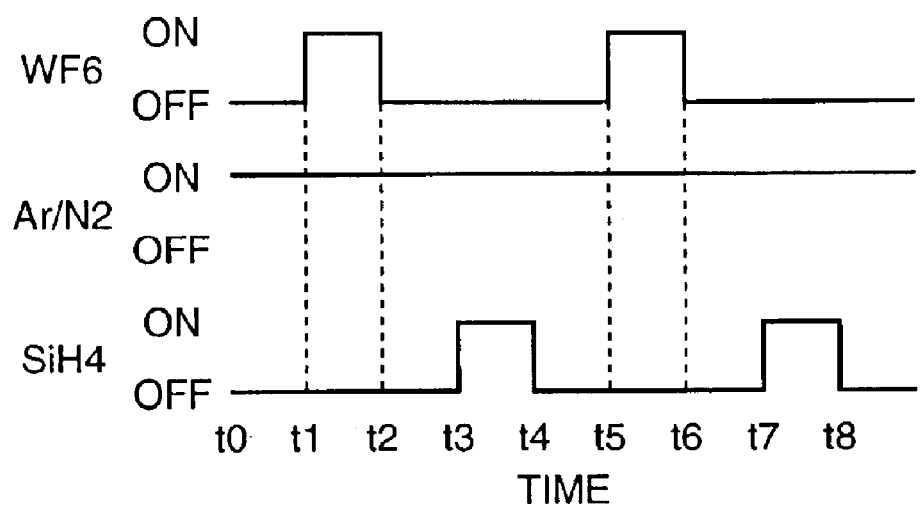
FIG. 5 is a timing chart showing the supply timings of individual reaction gases in the embodiment.

A sequence including steps 1 to 3 described above is repeated a plurality of number of times to form W nuclei. FIG. 5 is a timing chart showing the supply timings of the individual reaction gases.

First, Ar/$N_2$ inert gas is supplied from time t0 to time t1. Subsequently, $WF_6$/Ar/$N_2$ gas is supplied from time t1 to time t2. In this state, there is no reaction gas for $WF_6$, so $WF_6$ is uniformly adsorbed to the entire wafer surface including the interior of the contact hole.

The supply of the $WF_6$ gas is stopped at time t2, and only Ar/$N_2$ is allowed to flow until time t3 in order to exhaust the $WF_6$ gas atmosphere.

Then, $SiH_4$/Ar/$N_2$ gas is supplied from time t3 to time t4. In this state, $SiH_4$ reacts with $WF_6$ which is supplied beforehand and adsorbed to the substrate surface. Consequently, W film formation progresses to the interior of the contact hole.

The supply of the $SiH_4$ gas is stopped at time t4, and Ar/$N_2$ is allowed to flow until time t5 in order to exhaust the $SiH_4$ gas atmosphere.

From time t5, the aforementioned sequence is repeated a plurality of number of times. Consequently, W nuclei can be evenly formed on the entire wafer surface including the interior of the contact hole.

In step 3, a W film is formed using $WF_6$ gas and $H_2$ gas. The film thickness of this W film need only be one with which the contact hole is filled. To suppress invasion of $WF_6$ to the lower layer, the flow rates are preferably changed by two stages as shown below. Examples of the W film formation conditions are as follows.

[W formation conditions - first time]

| | |
|---|---|
| $WF_6$ gas flow rate | 70 sccm |
| Ar gas flow rate | 900 sccm |
| $H_2$ gas flow rate | 1,500 sccm |
| Pressure in chamber | $2.7 \times 10^3$ Pa (20 Torr) |
| Film formation temperature | 300° C. to 500° C., 370° C. in this embodiment |

[W formation conditions - second time]

| | |
|---|---|
| $WF_6$ gas flow rate | 90 sccm |
| Ar gas flow rate | 900 sccm |
| $H_2$ gas flow rate | 750 sccm |
| Pressure in chamber | $2.7 \times 10^3$ Pa (20 Torr) |
| Film formation temperature | 300° C. to 500° C., 370° C. in this embodiment |

In step 3, a low-resistance and high-coverage W film can be formed.

Figure 3I:
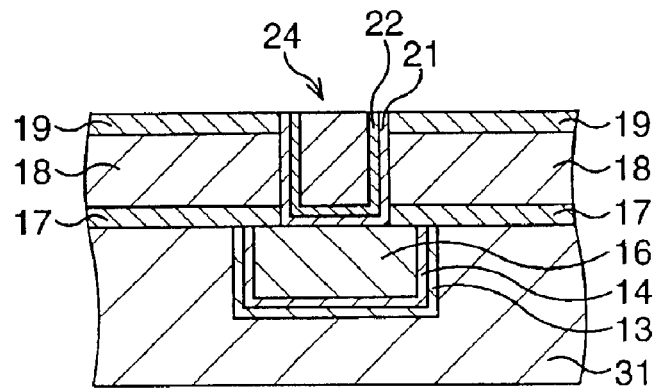

Subsequently, as shown in FIG. 3I, the W film 23 formed through steps 1 to 3 described above and the foundation layer are polished by a CMP method with using the interlayer insulating film 18 as a polishing stopper, thereby forming a W plug 24 which fills only the contact hole 20 via the foundation layer.

Figure 3J:
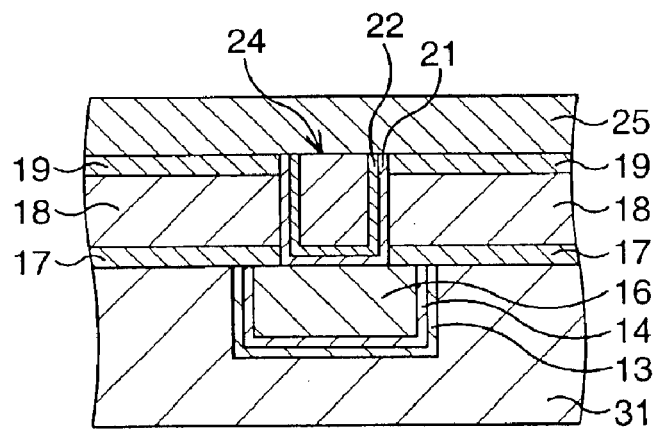

As shown in FIG. 3J, an Al film 25 about 800 nm is deposited on the entire surface by a sputtering method.

Figure 3K:
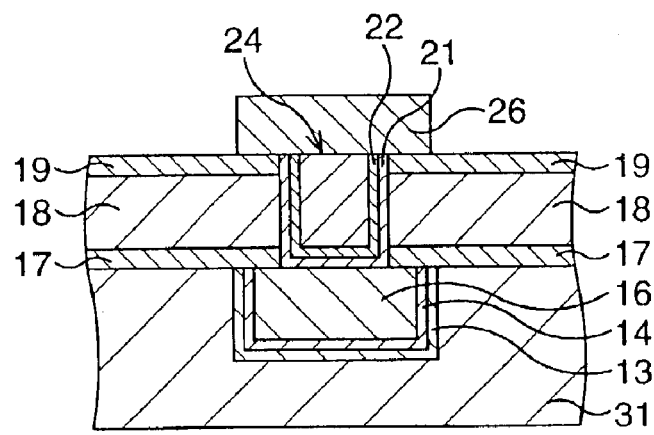

As shown in FIG. 3K, the Al film 25 is processed into the shape of an interconnection by photolithography and subsequent dry etching, thereby patterning an Al interconnection 26 connected to the W plug 24.

Through the above steps, an interconnection structure in which the lower Cu interconnection 16 and the upper Al interconnection 26 are electrically connected via the W plug 24 is completed.

Figure 6:
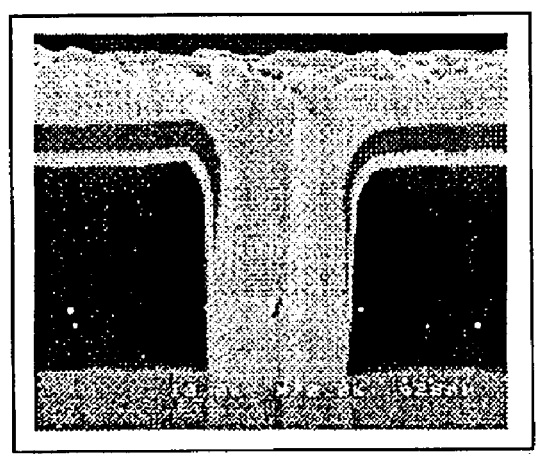
FIG. 6 is a view corresponding to a photomicrograph showing an interconnection structure formed by a way in which a Cu interconnection and a W plug are formed by using the interconnection structure formation method according to an embodiment of the present invention.

FIG. 6 shows the result of observation of a section of the interconnection structure which was actually formed by the above formation method and in which a W film was deposited as shown in FIG. 3H. FIG. 6 clearly indicates that there was no Cu elution in the contact hole.

After that, a MOS transistor is completed through steps of forming interlayer insulating films, via holes, upper interconnects, protective films, and the like.

As has been explained above, the present embodiment can form, with high reliability and no inconveniences, an interconnection structure including Cu interconnection—W plug—Al interconnection, in which although a lower interconnection is a Cu interconnection formed by the damascene process and a contact plug for the Cu interconnection is formed using W as a material, the contact hole is reliably filled with a W film while Cu elution from the Cu interconnection to the W plug is prevented.

That is, the present invention can realize an interconnection structure capable of preventing a wiring delay and achieving micropatterned, multilayer interconnection, and a highly reliable interconnection structure which solves various problems unique to the materials of the interconnection structure, e.g., elution of one material to the other. The application of this interconnection structure improves the performances of various semiconductor devices, and also improves the yield and productivity.

What is claimed is:

1. An interconnection structure comprising:

a lower interconnection made of a material containing at least copper;

an insulating film formed on said lower interconnection and having a hole which opens into said lower interconnection;

a refractory metal plug which fills only said hole and is electrically connected to said lower interconnection without elution from the material of said lower interconnection to said refractory metal plug, said refractory metal plug including refractory metal material nuclei and refractory metal material body which is formed in a step different from a step of forming said refractory metal material nuclei; and an upper interconnection made of material containing at least aluminum, and electrically connected to said lower interconnection on and via said refractory metal plug.

2. The structure according to claim 1, wherein said refractory metal contains tungsten.

3. The structure according to claim 1, further comprising a foundation layer which adheres to said lower interconnection and to which said refractory metal film adheres at least between said lower interconnection and said plug.

4. The structure according to claim 3, wherein said foundation layer is a member of the group consisting of a multilayered film of a tantalum compound layer and titanium compound layer, and a single-layered film selected from the group consisting of a tantalum compound layer and titanium compound layer.

* * * * *